United States Patent
Yamamoto et al.

(10) Patent No.: US 7,931,935 B2
(45) Date of Patent: Apr. 26, 2011

(54) PROCESS FOR PRODUCING MEMBRANE ELECTRODE ASSEMBLY, AND FUEL CELL USING THE MEMBRANE ELECTRODE ASSEMBLY PRODUCED BY THE PROCESS

(75) Inventors: Masaaki Yamamoto, Inzai (JP); Wu Mei, Yokohama (JP); Tsuyoshi Kobayashi, Kawasaki (JP); Taishi Fukazawa, Fuchu (JP); Itsuko Mizutani, Yokohama (JP); Yoshihiko Nakano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 497 days.

(21) Appl. No.: 12/049,770

(22) Filed: Mar. 17, 2008

(65) Prior Publication Data

US 2009/0050484 A1  Feb. 26, 2009

(30) Foreign Application Priority Data

Aug. 22, 2007  (JP) ................. 2007-216018

(51) Int. Cl.
  *H01M 8/10*  (2006.01)
  *H01M 8/00*  (2006.01)
  *C25B 1/00*  (2006.01)
  *C25B 1/04*  (2006.01)
  *C25B 1/06*  (2006.01)

(52) U.S. Cl. .......... 427/115; 427/58; 427/331; 427/337; 427/372.2; 427/377; 427/383.1; 429/400; 429/479; 429/482; 429/483

(58) Field of Classification Search .................. 427/115; 429/483
See application file for complete search history.

(56) References Cited

U.S. PATENT DOCUMENTS

| | | | | |
|---|---|---|---|---|
| 6,136,463 A | * | 10/2000 | Kindler et al. | 429/484 |
| 6,962,760 B2 | | 11/2005 | Rice et al. | |
| 2004/0191584 A1 | * | 9/2004 | Rice et al. | 429/13 |
| 2007/0254806 A1 | | 11/2007 | Mei et al. | |

OTHER PUBLICATIONS

U.S. Appl. No. 11/863,798, filed Sep. 28, 2007, Wu Mei, et al.
U.S. Appl. No. 11/863,856, filed Sep. 28, 2007, Wu Mei, et al.
A. Lewera, et al., "XPS and reactivity study of bimetallic nanoparticles containing Ru and Pt supported on a gold disk", Electrochimica Acta, vol. 51, 2006, pp. 3950-3956.

* cited by examiner

*Primary Examiner* — Timothy H Meeks
*Assistant Examiner* — Lisha Jiang
(74) *Attorney, Agent, or Firm* — Oblon, Spivak, McClelland, Maier & Neustadt, L.L.P.

(57) ABSTRACT

This invention provides a process for producing a membrane electrode assembly which has high and stable catalytic activity, and suppressed deterioration in catalytic activity during operation, and can prevent a deterioration in performance attributable to a structural factor of the membrane electrode assembly. The process comprises the step of, after the washing/removing step, drying the catalyst electrode in an atmosphere having a lower oxygen partial pressure than the air. The anode/cathode is a covered catalyst electrode having a structure formed by supporting/depositing a catalytically active material composed mainly of platinum/ruthenium subjected to the potential holding step, the washing/removing step, and the drying step, on a porous electroconductive carrier to cover at least a part of the porous electroconductive carrier with the ion conductive material.

14 Claims, 1 Drawing Sheet

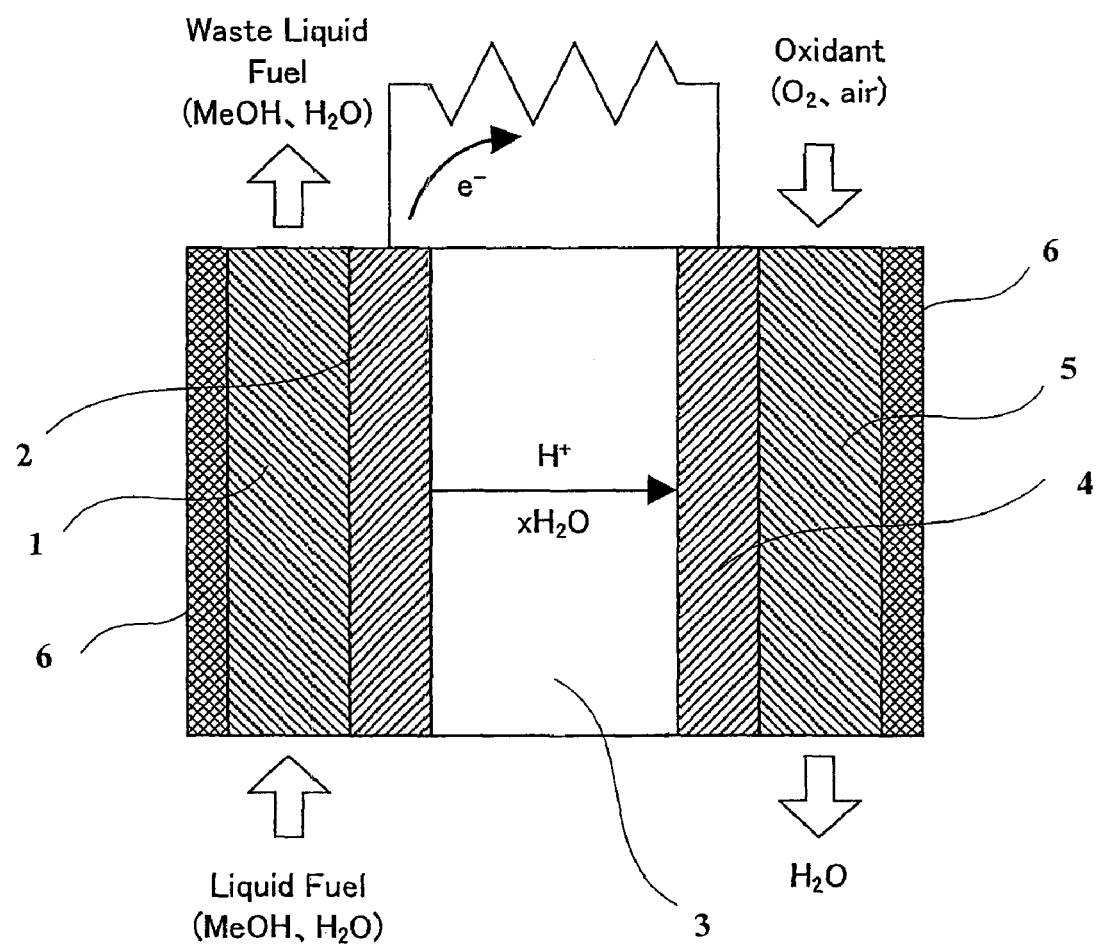

PROCESS FOR PRODUCING MEMBRANE ELECTRODE ASSEMBLY, AND FUEL CELL USING THE MEMBRANE ELECTRODE ASSEMBLY PRODUCED BY THE PROCESS

CROSS-REFERENCE TO RELATED APPLICATIONS

This application is based upon and claims the benefit of priority from the prior Japanese Patent Applications No. 216018/2007, filed on Aug. 22, 2007; the entire contents of which are incorporated herein by reference.

BACKGROUND OF THE INVENTION

1. Field of the Invention

This invention provides a process for producing a membrane electrode assembly, and a fuel cell using the membrane electrode assembly produced by the process.

2. Background Art

Fuel cells are used for electrochemically oxidizing a fuel such as hydrogen or methanol within a cell to convert chemical energy of the fuel directly into electric energy which is then taken out. In fuel cells, unlike thermal electric power generation, for example, $NO_x$ and $SO_x$ are not emitted upon combustion of a fuel. Accordingly, fuel cells have drawn attention as a clean electric energy supply source.

A membrane electrode assembly (fuel cell electromotive part) in the fuel cell has a construction comprising an anode (a catalyst electrode, a fuel electrode), a proton conductive film, and a cathode (a catalyst electrode, an oxidant electrode) stacked in that order on top of each other. For each of the anode and cathode, the catalyst electrode among these elements comprises a current collector and a catalyst layer. Accordingly, the membrane electrode assembly can also be said to have a construction comprising an anode current collector, an anode catalyst layer, a proton conductive film, a cathode catalyst layer, and a cathode current collector stacked in that order on top of each other. The current collector is usually formed of a porous electroconductive material and also functions to supply a fuel or an oxidant into the catalyst layer and thus is also called "diffusion layer". In fact, the catalyst layer does not always consist of a pure catalyst alone, and, in many cases, for example, the catalyst layer is a porous layer comprising materials constituting adjacent current collector and proton conductive film, that is, a catalytically active material, an electroconductive material, and a proton conductive material. Some catalyst layer has a construction comprising a catalytically active material supported directly on the porous electroconductive material as the current collector on its side in contact with the proton conductive film.

Direct methanol fuel cells will be described as an example. Specifically, a fuel mixture composed of methanol and water is supplied into an anode catalyst layer, and air (oxygen) is supplied into a cathode catalyst layer. In the electrodes, catalyst reactions respectively represented by chemical formulae (1) and (2) take place.

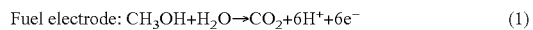

Fuel electrode: $CH_3OH+H_2O \rightarrow CO_2+6H^++6e^-$ (1)

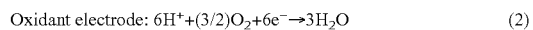

Oxidant electrode: $6H^++(3/2)O_2+6e^- \rightarrow 3H_2O$ (2)

As can be seen from the above chemical formulae, protons produced in the fuel electrode are transferred to the proton conductive film, and electrons are transferred to the anode current collector. In the oxidant electrode, a reaction takes place among the electrons supplied from the cathode current collector, the protons supplied from the proton conductive film, and oxygen, to allow current to flow across a pair of current collectors.

What is required for achieving excellent cell characteristics is to smoothly supply a suitable amount of a fuel to each of the electrodes, to cause a rapid and significant electrode catalyst reaction at a three-phase interface among the catalytically active material, the proton conductive material, and the fuel, to smoothly move electrons and protons, and to rapidly discharge the reaction product. In particular, the catalytic activity is highly important because the electric power which can be supplied is greatly influenced by the performance of the catalyst. In many cases, for both the cathode catalyst and the anode catalyst, platinum or an alloy containing platinum as a main constituent element is used from the viewpoints of the level of the activity and the demand for chemical stability. In particular, when methanol is directly used as a fuel, the adsorption of carbon monoxide as an intermediate material in the reaction on the surface of the catalyst deteriorates the catalytic activity. Accordingly, platinum is generally used as an alloy to promote a reaction of carbon monoxide with water. Alloys usable herein include an alloy of platinum with other platinum group element(s), for example, ruthenium, alloys of platinum with an element(s) other than the platinum group elements, and alloys of platinum with other platinum group element(s) and an element(s) other than the platinum group elements. In these catalysts, however, noble materials such as platinum group elements are necessary. Accordingly, even on the presumption that these materials are recycled, the total amount of these materials used should be reduced, and a high level of activity should be realized stably in a minimized amount of catalyst. From this viewpoint, a further increase in activity is also desired for catalysts comprising these platinum group elements as main constituent elements. In particular, in assembling a fuel cell comprising a plurality of membrane electrode assemblies connected in series, when there is a variation in catalytic activity for each membrane electrode assembly, the whole performance of the assembly is limited to the lowest performance in the performances possessed by the membrane electrode assemblies. To overcome this drawback, a large amount of catalyst should be used leading to a problem of an increase in the amount of noble resources used.

Methods for improving the activity of the catalyst to improve the properties of the fuel cell include a method in which current is allowed to flow from a cathode to an anode from an external power supply while supplying oxygen into a membrane electrode assembly on its cathode side and supplying a methanol fuel liquid to the anode side, and a method in which current is allowed to flow from a cathode to an anode from an external power supply while performing crossover of a large amount of methanol from the anode toward the cathode (U.S. Pat. No. 6,962,760).

In the above methods, hydrogen is evolved by electrolysis of a fuel liquid on the surface of a catalyst electrode on the anode side to reduce the surface of the catalyst and thus to improve the activity of the catalyst. In the above methods, however, when oxygen is allowed to flow toward the cathode, electrification causes an increase in potential of the cathode resulting in accelerated deterioration in the catalyst and surrounding constituent materials as a result of oxidation. The oxidation of methanol on the cathode side causes swelling of the proton conductive material by a large amount of over-crossed methanol which poses a problem that the performance of the cathode optimized for usual operation conditions is adversely affected. Further, since hydrogen gas is evolved in a bubble form on the anode side, separation of the contact interface of the catalyst and the proton conductive material or the proton conductive film sometimes takes place. Accordingly, continuation of the evolution of hydrogen for a long period of time poses a problem that the properties of the electrode are sometimes irreversibly deteriorated.

On the other hand, other method for improving the activity of the catalyst to improve the properties of the fuel cell disposed in the art comprises holding a small amount of a liquid containing catalyst particles as nanocolloid on a gold disk, drying the assembly in an inert atmosphere to prepare an electrode with catalyst particles held thereon, and electrolytically reducing the electrode in an aqueous sulfuric acid solution to improve the properties of the electrode over the properties of the electrode before the electrolytic reduction (A. Lewera et al, Electrochimica Acta, 51, 3950, (2006)). In fact, however, the electrode having catalytic activity improved by this method, when handled in the air, causes a considerably rapid deterioration in properties. Accordingly, the electrode treated by this method involves a problem that handling of the electrode in the air is difficult. Further, the following fact should be noted. In this supporting method, the substrate is gold, and the catalytically active material supported is nanoparticles of platinum group metal. Therefore, the catalytically active material is relatively strongly held. The application to a substrate having a porous structure which causes diffusion of a fuel, however, poses a problem that the holding strength is unsatisfactory.

SUMMARY OF THE INVENTION

As described above, it is known that the evolution of hydrogen by electrolytic reduction of hydrogen ions on the surface of the catalyst can improve catalytic activity. However, any method in which a membrane electrode assembly is produced using this improvement method without inducing other property deterioration factors has not hitherto been known in the art.

The present inventors have found that, although drying of an activated catalyst, wetted with water, in the air causes a significant deterioration in catalytic activity, drying of the catalyst in an atmosphere having a lower oxygen partial pressure than the air, for example, in nitrogen or in an evacuated state followed by exposure to the air can unexpectedly significantly suppress the catalytic activity deterioration rate after that. They have further found that the catalytically active material covered with an ion conductive material can realize further suppression of a lowering in activity in the air. The present invention has been made based on such finding.

Thus, according to the present invention, there is provided a process for producing a membrane electrode assembly, comprising: a potential holding step of applying a voltage to a catalyst electrode in an aqueous electroconductive solution and holding the potential of the catalyst electrode at a hydrogen evolution potential; a washing/removing step of, after the potential holding step, washing the catalyst electrode and removing the aqueous electroconductive solution held by the catalyst electrode; a drying step of, after the washing/removing step, drying the catalyst electrode in an atmosphere having a lower oxygen partial pressure than the air; a stacking step of, after the drying step, stacking at least an anode, a proton conductive film, and a cathode; and a covering step of, at any stage before the stacking step, covering at least a part of a catalytically active material in the catalyst electrode with an ion conductive material, wherein the anode and/or the cathode are a covered catalyst electrode having a structure formed by supporting or depositing a catalytically active material composed mainly of platinum and/or ruthenium subjected to the potential holding step, the washing/removing step, and the drying step, on a porous electroconductive carrier to cover at least a part of the porous electroconductive carrier with the ion conductive material.

In a preferred embodiment of the present invention, the anode is a covered catalyst electrode having a structure comprising a catalytically active material, composed mainly of platinum and/or ruthenium and subjected to the potential holding step, the washing/removing step, and the drying step, supported or deposited on a porous electroconductive carrier, and an ion conductive material covering at least a part of the catalytically active material, and the fuel for the anode is methanol.

According to another aspect of the present invention, there is provided a fuel cell comprising a membrane electrode assembly produced by the above process.

BRIEF DESCRIPTION OF THE DRAWING

FIG. 1 is a typical cross-sectional view showing one embodiment of a membrane electrode assembly according to the present invention.

DETAILED DESCRIPTION OF THE INVENTION

<Construction of Membrane Electrode Assembly for Fuel Cell>

The membrane electrode assembly for a fuel cell typically has a construction comprising an anode catalyst electrode, a proton conductive film, and a cathode catalyst electrode stacked on top of each other. The anode catalyst electrode and the cathode catalyst electrode (often collectively referred to simply as "catalyst electrode") typically comprise a combination of an anode current collector with an anode catalyst layer, and a combination of a cathode current collector and a cathode catalyst layer, respectively.

A specific example of a fundamental structure of a membrane electrode assembly in a direct methanol-type solid polymer fuel cell (DMFC), which is one embodiment of the present invention, will be described in conjunction with FIG. 1.

The membrane electrode assembly (fuel cell electromotive part) shown in FIG. 1 comprises an anode current collector 1, an anode catalyst layer 2, a proton conductive film 3, a cathode catalyst layer 4, and a cathode current collector 5 stacked in that order on top of each other. A flow passage plate 6, which is not a constituent element of the membrane electrode assembly, is provided on the outer side of the anode current collector 1 and the cathode current collector 5. The anode catalyst layer 2 and the cathode catalyst layer 4 have a structure comprising a carbon paper having a structure of a fibrous carbon nonwoven fabric as a porous electroconductive material, platinum alloy-type fine particles of a nano size as a catalytically active material supported (or deposited) on the carbon paper, and a proton conductive material covering at least a part of the surface of the fine particles to form an ion conduction path to the proton conductive film. In addition to the above structure, the structure of the anode catalyst layer 2 and the cathode catalyst layer 4 may also be such that carbon fine particles bearing platinum alloy-type fine particles of nano size as a catalytically active material are further supported (or deposited) on the carbon paper and a proton conductive material, which functions also as a binder, covers at least a part of the surface of the platinum alloy-type fine particles of nano size to form an ion conduction path to the proton conductive film.

<Catalyst Electrode>

The term "catalyst electrode" as used herein embraces both an anode catalyst electrode typically comprising an anode current collector and an anode catalyst layer, and a cathode catalyst electrode typically comprising a cathode current collector and a cathode catalyst layer. The term "covered catalyst electrode" as used herein refers to a catalyst electrode having a structure comprising a catalyst electrode at least a part of which has been covered with an ion conductive material.

In the catalyst layers (the anode catalyst layer and the cathode catalyst layer), the catalytically active material may be typically nano particles of platinum and/or ruthenium. Further, the catalytically active material may comprise platinum and/or ruthenium nano particles deposited on the surface of carbon particles. Typical anode catalysts include PtRu alloy and PtRuAl alloy. Typical cathode catalysts include platinum (Pt) as a simple substance.

The current collectors (the anode current collector and the cathode current collector) may be typically formed of a porous electroconductive material and may be used as a porous electroconductive carrier for supporting the catalyst.

For example, carbon paper may be mentioned as the porous electroconductive material.

The covered catalyst electrode may comprise a catalyst electrode having a surface covered with an ion conductive material. For example, the covered catalyst electrode may be one produced by coating a slurry containing Nafion (tradename) (perfluorosulfonic acid/PTFE copolymer (H$^+$) type), which is available, for example, from Du Pont, for example, onto the surface of a catalyst electrode and drying the coated catalyst electrode.

<Process for Producing Catalyst Electrode to be Treated>

Processes for producing a catalyst electrode to be treated, for example, by the potential holding step according to the present invention are typically divided into a wet process and a dry process. A slurry method and a deposition impregnation method as the wet process and a sputtering method as the dry process will be described. In the present invention, other electrode production methods such as transfer methods may also be used.

In the slurry method, at the outset, water is added to a catalyst. The mixture is stirred thoroughly. A proton conductive solution and an organic solvent are added thereto, and the mixture is stirred thoroughly and is dispersed to prepare a slurry. The organic solvent is composed of a single solvent or a solvent mixture composed of two or more solvents. In the above dispersing procedure, conventional dispergators, for example, ball mills, sound mills, bead mills, paint shakers, and nanomizers may be used to produce a slurry composition as a dispersion liquid.

An electrode with an electrode composition may be produced by coating the dispersion liquid (slurry composition) thus obtained onto a porous electroconductive material (a carbon paper or a carbon cloth) by various methods and then drying the assembly.

In the deposition impregnation method, a fiber-shaped catalyst and a particulate catalyst are weighed in a predetermined proportion ratio. Water is added to the mixture, and the mixture is thoroughly stirred followed by dispersion to deposit the catalyst on a porous electroconductive material (a carbon paper or a carbon cloth) to form a catalyst layer. The assembly is dried, is immersed in a solution containing a proton conductive material dissolved therein to impregnate the catalyst layer with the solution, and is dried to produce an electrode with an electrode composition. The catalyst may be deposited by any of a vacuum suction filtration method and a spray method.

According to the sputtering method, metals, which cannot be reduced by the solution method or electrodeposition method, and their alloys can be produced. Further, the composition of the alloy can be relatively easily regulated. An example of the production of a catalytically active material of a platinum-ruthenium-aluminum alloy will be described. An alloy (PtRuAl) having a contemplated composition is first produced by arc melting. This alloy is used as a target (preferably having a circular smooth surface with a diameter of not less than 2 cm). This target is mounted within a sputtering device and is sputtered on a porous electroconductive material (a carbon paper or a carbon cloth) to produce a catalytically active material having a fine particle structure which is in intimate contact with the porous electroconductive material. Regarding the sputtering device, for example, the use of an ion beam sputtering device can realize a stable composition. The chamber is satisfactorily evacuated (not more than $3 \times 10^{-6}$ Torr), and an argon gas is allowed to flow for sputtering. The structure can be regulated by regulating the current, voltage, and acceleration voltage of an ion gun beam of the target. An oxide or a nitride can be sputtered by incorporating oxygen, nitrogen or the like in the argon atmosphere. Further, the structure of the catalyst can be significantly changed by regulating the substrate temperature in the sputter (here the temperature of the porous electroconductive material). Enhancing the degree of crystallization and changing the particle diameter are also possible. When the temperature is not brought to an optimal value, phase separation takes place. In this case, alloying is sometimes impossible. Accordingly, the temperature is preferably varied depending upon properties possessed by the elements or a combination of the elements. In the production of the catalyst, the substrate temperature in the sputter is preferably 400° C. or below.

An assembly comprising a carbon paper and a catalytically active material supported directly on the carbon paper by a sputtering method or a solution process is advantageous in that a high level of adhesion between the porous electroconductive material and the catalytically active material can be realized and disconnection of electrical contact is less likely to occur even when bubbles are produced by holding the hydrogen evolution potential. Accordingly, this is further preferred in practicing the present invention.

<Potential Holding Step>

The catalyst electrode thus obtained is then subjected to a potential holding step in which voltage is applied to the catalyst electrode in an aqueous electroconductive solution, and the potential of the catalyst electrode is held at a hydrogen evolution potential. Aqueous electroconductive solutions include, but are not limited to, for example, sulfuric acid and perchloric acid.

The catalyst electrode can be brought to a hydrogen evolution potential by energization using an inert electrode such as platinum or carbon as a counter electrode and the catalyst electrode per se as a negative electrode. In particular, the potential can be more accurately regulated with a potentiostat using a reversible hydrogen electrode as a reference electrode. The potential holding time is 1 to 60 min, preferably 5 to 15 min. When the potential holding time is shorter than this time period, charging is unsatisfactory. On the other hand, when the potential holding time is longer than this time period, the productivity is sacrificed. Further, when the amount of hydrogen evolved is large, a deterioration in the electrode structure caused by bubbles of evolved hydrogen is not negligible.

<Washing/Removing Step>

After the potential holding step, the catalyst electrode is subjected to a washing/removing step in which the aqueous electroconductive solution held by the catalyst electrode is removed by washing. This washing is typically washing with water.

<Drying Step>

After the washing/removing step, the catalyst electrode is subjected to a drying step in which the catalyst electrode is dried in an atmosphere having a lower oxygen partial pressure than the air. The oxygen partial pressure is preferably not more than 0.1 atm, more preferably not more than 0.01 atm. The copresence of water and oxygen synergistically accelerates the formation of a film on the surface of the catalyst. Accordingly, the lower the oxygen partial pressure, the better the results. Further, the combined use of the above drying and vacuum drying, which lowers the total gas partial pressure, from the viewpoint of accelerating the removal of water by drying is more preferred.

<Stacking Step>

The catalyst electrode subjected to a series of steps up to the drying step (and the covering step which will be described later) is used in the anode and/or the cathode and is subjected to a stacking step in which the anode, the proton conductive film, and the cathode are thermally contact bonded to each other to form a membrane electrode assembly. That is, a covered catalyst electrode comprising a porous electroconductive carrier, a catalytically active material comprising platinum and/or ruthenium as a main component and supported or deposited on the porous electroconductive carrier, and an ion conductive material covering at least a part of the catalytically active material, which had been subjected to the potential holding step, the washing/removing step, and the drying step, is adopted as the anode and/or the cathode. The term "main components" as used herein means that not less than 50% by mole, preferably not less than 70% by mole, more preferably not less than 80% by mole, of the material is accounted for by the component. Preferably, the anode is the covered catalyst electrode, and the fuel for the anode is methanol.

For example, anion or cation conductive materials such as polymer films typified by perfluoroalkylsulfonic acid polymers are usable as the proton conductive films.

In the stacking step, specifically, for example, a method is used which comprises disposing an anode catalyst electrode and a cathode catalyst electrode (for example, having a structure comprising a porous electroconductive material and an ion conductive material having both a function as a catalytically active material and a function as a binder, for example, Nafion (tradename), fixed onto the porous electroconductive material) respectively onto both sides of a proton conductive material and subjecting the assembly to contact bonding by a hot press (or a roll). Thermal contact bonding for providing a membrane electrode assembly is preferably carried out under conditions of a temperature 100° C. or above and 180° C. or below, a pressure of 10 to 200 kg/cm$^2$ and a contact bonding time of not less than 1 min and not more than 30 min. An additional example of a method usable in the stacking step comprises providing an assembly produced by coating a paste containing an ion conductive material having both a function as a catalytically active material and a function as a binder, for example, Nafion (tradename), on both sides of a proton conductive film and drying the coated film, disposing a porous electroconductive material on the coated film, and hot pressing the assembly. In this case, the same effect as attained by subjecting the catalyst electrode to potential holding step can be realized by holding each face of the proton conductive film at a hydrogen evolution potential.

<Covering Step>

The catalyst electrode is subjected to a covering step in which, at any stage before the stacking step, at least a part of the catalytically active material in the catalyst electrode is covered with an ion conductive material. Examples of ion conductive materials usable herein include, for example, sulfonic acid group-containing fluororesins such as Nafion (tradename) (manufactured by Du Pont), Flemion R (manufactured by Asahi Glass Co., Ltd.), and Aciplex R (manufactured by Asahi Kasei Corporation), and inorganic materials such as tungstic acid and phosphotungstic acid. The ion conductive material, however, is not limited to these examples only.

The covering step may be carried out before the potential holding step or after the drying step. When the covering step is carried out after the drying step, preferably, the covering step is carried out in an atmosphere having a lower oxygen partial pressure than the air. More preferably, the drying step and the covering step are continuously carried out in an atmosphere having a lower oxygen partial pressure than the air without exposure to the air during this step. In the covering step under such conditions that oxygen and water coexist, as compared with a dried catalyst surface, a lowering in catalytic activity considered attributable to the formation of a film on the catalyst surface is significant, and drying in vacuo and/or an atmosphere having a low oxygen partial pressure is important for maintaining the catalytic activity. In particular, for the part free from the covering of the proton conductive film, oxidation upon handling in the air is significant, and the effect attained by the treatment in the low oxygen atmosphere appears clearly.

When the amount of the deposited ion conductive material covering the catalytically active material is excessively large, in some cases, the state of contact is deteriorated by foaming caused during hydrogen evolution. On the other hand, when the amount of the ion conductive material deposited is excessively small, a lowering in ion conductivity becomes a rate limiting factor, and the electric power generation capacity of the membrane electrode assembly is lowered. These drawbacks can be advantageously overcome by supporting or depositing a part of a necessary amount of the ion conductive material before the hydrogen evolution potential holding and then conducting surface covering using the remaining amount of the ion conductive material after the hydrogen evolution potential holding.

<Fuel Cell>

The fuel cell according to the present invention is a fuel cell using the membrane electrode assembly according to the present invention as a fuel cell electromotive part. Preferably, membrane electrode assemblies according to the present invention are connected in series or parallel for use as a fuel cell, and a plurality of such fuel cells are connected in series. This construction is more preferred because the feature of the present invention appears more effectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

Embodiments of the present invention will be further described by the following Examples which are specific but not limitative of the present invention.

Example 1

(Anode Catalyst Electrode)

An anode catalyst electrode was produced by a suction filtration method. Specifically, 75 mg of a particulate supported catalyst comprising 40% $PtRu_{1.5}$ supported on a carbon black having an average primary particle diameter of about 30 to 60 nm, a specific surface area of about 40 to 100 $m^2/g$, and a DBP oil absorption of 30 to 100 ml/100 g was weighed. Pure water (150 g) was added to the particulate supported catalyst, and the mixture was thoroughly stirred and dispersed to prepare a mixed liquid. The mixed liquid thus obtained was subjected to suction filtration under the reduced pressure through a carbon paper of 10 $cm^2$ (360 μm, bulk density 0.45) subjected to water repellent treatment to deposit the supported catalyst on the carbon paper, followed by drying. Next, a solution containing 4% of Nafion (tradename) (perfluorosulfonic acid/PTFE copolymer ($H^+$) type, manufactured by Du Pont), which is an ion conductive material (a proton conductive material), was impregnated under the reduced pressure, and the assembly was then dried. The above procedure resulted in a weight increase of 35 mg of the catalyst layer. Accordingly, it is considered that 5 mg of the proton conductive material was deposited. A gold wire was brought into contact with the carbon paper having a noble metal loading density of about 3 $mg/cm^2$ to provide a lead wire, followed by immersion in a 0.5 M aqueous sulfuric acid solution. A platinized platinum electrode was provided as a counter electrode, and the potential was held at −0.05 V vs. a reversible hydrogen electrode for 10 min. Immediately after that, water washing was repeated to remove sulfuric acid. In the wetted state, the assembly was transferred to a desiccator provided with a vacuum pump, and evacuation and dry nitrogen introduction were repeated to perform drying in an atmosphere having a lower oxygen partial pressure than the air. Specifically, the system was evacuated from the air atmosphere to not more than 0.1 atm with a vacuum pump, and nitrogen gas was introduced to about 1 atm. The system was again evacuated to not more than 0.1 atm with the vacuum pump, and the nitrogen gas was introduced to about 1 atm.

Thereafter, the system was again evacuated to not more than 0.1 atm with the vacuum pump, and, in this state, the evacuated state was continued for 6 hr to perform drying. It was confirmed that the pressure within the desiccator after the continuation of the evacuation for 6 hr was not more than 0.01 atm. Accordingly, when the fact that the internal pressure of the desiccator is not more than 0.01 atm and most of gas which stays within the desiccator is nitrogen gas, is taken into consideration, it is considered that the oxygen partial pressure during drying is substantially not more than 0.001 atm. After drying, the assembly was taken out of the desiccator and was allowed to stand for 5 days in a usual indoor atmosphere, followed by use in assembling of a membrane electrode assembly by hot pressing.

(Cathode Catalyst Electrode)

A cathode catalyst electrode was produced by a slurry method. Specifically, 1 g of a particulate supported catalyst comprising 50% by weight of platinum (Pt) fine particles supported on a particulate carbon having a specific surface area of not less than about 40 $m^2/g$, an average diameter of 50 nm, an aspect ratio of about 1, and 2 g of pure water were stirred thoroughly. Further, 4.5 g of a 20% Nafion (tradename) solution and 10 g of 2-ethoxyethanol were added thereto, and the mixture was stirred thoroughly and was then dispersed in a bench ball mill to prepare a slurry composition. The above slurry composition was coated by a control coater onto a carbon paper (360 μm, bulk density 0.45) subjected to water repellent treatment. The assembly was air dried for 5 days to produce a cathode catalyst electrode having a catalyst loading density of 2 $mg/cm^2$. Further, the cathode catalyst electrodes of Examples of the present invention and Comparative Examples except for Example 2 were produced in the same manner as described above.

(Production of Membrane Electrode Assembly (MEA))

The cathode catalyst electrode and the anode catalyst electrode were cut into a size of 3.2×3.2 cm square so that the electrode area of each of the cathode catalyst electrode and the anode catalyst electrode was 10 $cm^2$. Nafion (tradename) 117 was held as a proton conductive film between the cathode catalyst electrode and the anode catalyst electrode, followed by thermocompression bonding under conditions of temperature 125° C., time 10 min, and pressure 50 $kg/cm^2$ to produce a membrane electrode assembly (MEA) having the above-described structure shown in FIG. 1. All the membrane electrode assemblies of Examples of the present invention and Comparative Examples were produced in the same manner as described above. The membrane electrode assemblies according to the present invention are not limited to these Examples.

A single cell of a direct methanol supply-type polymer electrolyte fuel cell was produced using the membrane electrode assembly (MEA) and a flow passage plate. A 1 M aqueous methanol solution as a fuel was supplied into the single cell in its anode electrode at a flow rate of 0.6 ml/min, and, at the same time, air was supplied into the cathode electrode at a flow rate of 100 ml/min. In such a state that the cell was held at 70° C., the cell voltage at a current density of 150 $mA/cm^2$ was measured. The results are shown in Table 1.

Example 2

The carbon paper on which the slurry composition had been coated followed by air drying in the preparation of a cathode electrode was provided. A gold wire was brought into contact with the carbon paper to provide a lead wire, and the assembly was then held in a 0.5 M aqueous sulfuric acid solution. A platinized platinum electrode was provided as a counter electrode, and the potential was held at −0.05 V vs. a reversible hydrogen electrode for 10 min. Immediately after that, water washing was repeated to remove sulfuric acid. In the wetted state, the assembly was transferred to a desiccator provided with a vacuum pump, and evacuation and dry nitrogen introduction were repeated in the same manner as in Example 1 to perform drying in an atmosphere having a lower oxygen partial pressure than the air. Thereafter, after drying, the assembly was taken out of the desiccator and was allowed to stand for 5 days in a usual indoor atmosphere, followed by use in assembling of a membrane electrode assembly by hot pressing.

Except for the above matter, the procedure of Example 1 was repeated to perform evaluation. The results are shown in Table 1.

Example 3

After the dispersed and mixed liquid was subjected to suction filtration followed by drying, a solution containing 2% of Nafion (tradename) (manufactured by Du Pont), which is an ion conductive material (a proton conductive material), was impregnated under the reduced pressure, and the assembly was then dried, whereby a 2.5 mg of the proton conductive material was deposited onto the carbon paper. A gold wire was brought into contact with the carbon paper to provide a lead wire, and the assembly was then held in a 0.5 M aqueous sulfuric acid solution. A platinized platinum electrode was provided as a counter electrode, and the potential was held at −0.05 V vs. a reversible hydrogen electrode for 10 min. Immediately after that, water washing was repeated to remove sulfuric acid. In the wetted state, the assembly was transferred to a desiccator provided with a vacuum pump, and evacuation and dry nitrogen introduction were repeated in the same manner as in Example 1 to perform drying in an atmosphere having a lower oxygen partial pressure than the air. Subsequently, a solution containing 20% of Nafion (tradename) (manufactured by Du Pont) dissolved therein was impregnated under the reduced pressure in an atmosphere having a lower oxygen partial pressure than the air followed by drying. After drying, the assembly was taken out of the desiccator and was allowed to stand for 5 days in a usual indoor atmosphere, followed by use in assembling of a membrane electrode assembly by hot pressing.

Except for the above matter, the procedure of Example 1 was repeated to perform evaluation. The results are shown in Table 1.

Example 4

A catalyst for the anode was produced by sputtering. Specifically, a carbon paper (thickness 360 μm, bulk density 0.45 g/cm$^3$) to which water repellency had been imparted, was provided as a substrate. Deposition was carried out by sputtering using a target having a composition of $Pt_{0.45}Ru_{0.45}Al_{0.1}$ to an average alloy coverage of 2 mg/cm$^2$. A gold wire was brought into contact with the carbon paper to provide a lead wire, and the assembly was then held in a 0.5 M aqueous sulfuric acid solution. A platinized platinum electrode was provided as a counter electrode, and the potential was held at −0.05 V vs. a reversible hydrogen electrode for 10 min. Immediately after that, water washing was repeated to remove sulfuric acid. In the wetted state, the assembly was transferred to a desiccator provided with a vacuum pump, and evacuation and dry nitrogen introduction were repeated in the same manner as in Example 1 to perform drying in an atmosphere having a lower oxygen partial pressure than the air. After drying, the assembly was subsequently immersed in a 4% Nafion (tradename) solution in the atmosphere having a low oxygen partial pressure, and the system was evacuated to permeate the Nafion (tradename) solution into the inside of the assembly and was then dried. The electrode was then taken out into the air and was allowed to stand for 5 days in a usual indoor atmosphere, followed by use in assembling of a membrane electrode assembly by hot pressing.

Except for the above matter, the procedure of Example 1 was repeated to perform evaluation. The results are shown in Table 1.

Example 5

A catalyst for the anode was produced by sputtering. Specifically, a carbon paper (thickness 360 μm, bulk density 0.45 g/cm$^3$) to which water repellency had been imparted, was provided as a substrate. Deposition was carried out by sputtering using a target having a composition of $Pt_{0.45}Ru_{0.45}Al_{0.1}$ to an average alloy coverage of 2 mg/cm$^2$. A gold wire was brought into contact with the carbon paper to provide a lead wire, and the assembly was then held in a 0.5 M aqueous sulfuric acid solution. A platinized platinum electrode was provided as a counter electrode, and the potential was held at −0.05 V vs. a reversible hydrogen electrode for 10 min. Immediately after that, water washing was repeated to remove sulfuric acid. In the wetted state, the assembly was transferred to a desiccator provided with a vacuum pump, and evacuation and dry nitrogen introduction were repeated in the same manner as in Example 1 to perform drying in an atmosphere having a lower oxygen partial pressure than the air. After drying, the assembly was taken out into the air and was subsequently immersed in a 4% Nafion (tradename) solution, and the system was evacuated to permeate the Nafion (tradename) solution into the inside of the assembly and was then dried in the air. The assembly was allowed to stand for 5 days in a usual indoor atmosphere, followed by use in assembling of a membrane electrode assembly by hot pressing.

Except for the above matter, the procedure of Example 1 was repeated to perform evaluation. The results are shown in Table 1.

Example 6

A catalyst for the anode was produced by sputtering. Specifically, a carbon paper (thickness 360 μm, bulk density 0.45 g/cm$^3$) to which water repellency had been imparted, was provided as a substrate. Deposition was carried out by sputtering using a target having a composition of $Pt_{0.45}Ru_{0.45}Al_{0.1}$ to an average alloy coverage of 2 mg/cm$^2$. A gold wire was brought into contact with the carbon paper to provide a lead wire, and the assembly was then held in a 0.5 M aqueous sulfuric acid solution. A platinized platinum electrode was provided as a counter electrode, and the potential was held at −0.05 V vs. a reversible hydrogen electrode for 10 min. Immediately after that, water washing was repeated to remove sulfuric acid. In the wetted state, the assembly was transferred to a desiccator provided with a vacuum pump, and evacuation and dry nitrogen introduction were repeated in the same manner as in Example 1 to perform drying in an atmosphere having a lower oxygen partial pressure than the air. After drying, the assembly was taken out into the air and was immersed in a 4% Nafion (tradename) solution, and the the system was evacuated to permeate the Nafion (tradename) solution into the inside of the assembly. The assembly was again transferred to a desiccator, and evacuation and dry nitrogen introduction were repeated to perform drying in an atmosphere having a lower oxygen partial pressure than the air. Thereafter, the assembly was allowed to stand for 5 days in a usual indoor atmosphere, followed by use in assembling of a membrane electrode assembly by hot pressing.

Except for the above matter, the procedure of Example 1 was repeated to perform evaluation. The results are shown in Table 1.

Example 7

A catalyst for the anode was produced by sputtering. Specifically, a carbon paper (thickness 280 μm, bulk density 0.45 g/cm$^3$) to which water repellency had been imparted, was provided as a substrate. Deposition was carried out by sputtering using a target having a composition of $Pt_{0.45}Ru_{0.45}Al_{0.1}$ to an average alloy coverage of 2 mg/cm$^2$. A gold wire was brought into contact with the carbon paper to provide a lead wire, and the assembly was then held in a 0.5 M aqueous sulfuric acid solution. A platinized platinum electrode was provided as a counter electrode, and the potential was held at −0.05 V vs. a reversible hydrogen electrode for 10 min. Immediately after that, water washing was repeated to remove sulfuric acid. In the wetted state, the assembly was transferred to a desiccator provided with a vacuum pump, and evacuation and dry nitrogen introduction were repeated in the same manner as in Example 1 to perform drying in an atmosphere having a lower oxygen partial pressure than the air.

After drying, the assembly was taken out of the desiccator into the air and was allowed to stand for 5 days in the air and was then immersed in a 4% Nafion (tradename) solution, and the system was evacuated to permeate the Nafion (tradename) solution into the inside of the assembly. Thereafter, the assembly was again transferred into a desiccator provided with a vacuum pump, and evacuation and dry nitrogen introduction were repeated to conduct drying in an atmosphere having a lower oxygen partial pressure than the air. The electrode was then taken out into the air and was used in assembling of a membrane electrode assembly by hot pressing.

Except for the above matter, the procedure of Example 1 was repeated to perform evaluation. The results are shown in Table 1.

Example 8

Evaluation was carried out in the same manner as in Example 1, except that drying in the production of an anode catalyst electrode was carried out by nitrogen gas flow drying as follows. A more specific drying procedure was as follows. Evacuation was carried out by a vacuum pump from an air atmosphere to not more than 0.1 atm. Subsequently, nitrogen gas was introduced into the system to about 1 atm. Thereafter, the system was again evacuated to not more than 0.1 atm by a vacuum pump, and nitrogen gas was introduced into the system to about 1 atm. An exhaust port in the desiccator was then opened, and nitrogen gas (5 liters per min) was allowed to flow from the injection side for 6 hr for drying. Accordingly, the atmosphere during the drying is considered to be a pure nitrogen gas atmosphere of about 1 atm.

The results are shown in Table 1.

Comparative Example 1

In the production of the anode catalyst electrode, after the deposition of a supported catalyst on a carbon paper, the assembly was dried for 5 days in the air without hydrogen evolution potential holding followed by use in the assembly of a membrane electrode assembly by hot pressing.

Except for the above matter, the procedure of Example 1 was repeated to perform evaluation. The results are shown in Table 1.

Comparative Example 2

In the production of the anode catalyst electrode, the catalyst for the anode was produced by sputtering. Specifically, a carbon paper (thickness 360 μm, bulk density 0.45 g/cm$^3$) to which water repellency had been imparted, was provided as a substrate. Deposition was carried out by sputtering using a target having a composition of $Pt_{0.45}Ru_{0.45}Al_{0.1}$ to an average alloy coverage of 2 mg/cm$^2$. A gold wire was brought into contact with the carbon paper to provide a lead wire, and the assembly was then held in a 0.5 M aqueous sulfuric acid solution. A platinized platinum electrode was provided as a counter electrode, and the potential was held at −0.05 V vs. a reversible hydrogen electrode for 10 min. Immediately after that, water washing was repeated to remove sulfuric acid followed by drying in the air. After the completion of the drying, the assembly was transferred to a desiccator provided with a vacuum pump, and evacuation and dry nitrogen introduction were repeated in the same manner as in Example 1 to perform drying in an atmosphere having a lower oxygen partial pressure than the air. After drying, the assembly was subsequently immersed in a 4% Nafion (tradename) solution in the atmosphere having a low oxygen partial pressure, and the system was evacuated to permeate the Nafion (tradename) solution into the inside of the assembly and was then dried. The dried electrode was then taken out into the air and was allowed to stand for 5 days in a usual indoor atmosphere, followed by use in assembling of a membrane electrode assembly by hot pressing.

Except for the above matter, the procedure of Example 4 was repeated to perform evaluation. The results are shown in Table 1.

The present invention is not limited to the above embodiments. In practicing the invention, structural elements may be modified and embodied without departing from the spirit of the invention. A plurality of structural elements disclosed in the embodiments may be properly combined to constitute various inventions. For example, some of structural elements may be omitted from all the structural elements in the embodiments. Further, structural elements in different embodiments may be properly combined.

TABLE 1

|  | Anode | Cathode | Anode hydrogenation | Cathode hydrogenation | Hydrogenation followed by drying in inert atmosphere | Post-addition of Nafion | Nafion addition and drying in inert atmosphere | Drying continuous treatment | Standing in air (days) | Voltage, (V) (150 mA/cm$^2$) | Remarks |
|---|---|---|---|---|---|---|---|---|---|---|---|
| Ex. 1 | Suction filtration 3 mg | Slurry 2 mg | ○ | x | ○ | x | No post-addtion portion | No post-addtion portion | 5 | 0.49 | |
| Ex. 2 | Suction filtration 3 mg | Slurry 2 mg | ○ | ○ | ○ | x | No post-addtion portion | No post-addtion portion | 5 | 0.51 | |
| Ex. 3 | Suction filtration 3 mg | Slurry 2 mg | ○ | x | ○ | Δ (Half amount) | ○ | ○ | 5 | 0.51 | |
| Ex. 4 | Sputtering 3 mg | Slurry 2 mg | ○ | x | ○ | ○ | ○ | ○ | 5 | 0.51 | |
| Ex. 5 | Sputtering 3 mg | Slurry 2 mg | ○ | x | ○ | ○ | x | x | 5 | 0.48 | |
| Ex. 6 | Sputtering 3 mg | Slurry 2 mg | ○ | x | ○ | ○ | ○ | x | 5 | 0.5 | |
| Ex. 7 | Sputtering 3 mg | Slurry 2 mg | ○ | x | ○ | ○ | ○ | x | 5 | 0.46 | |

TABLE 1-continued

|  | Anode | Cathode | Anode hydrogenation | Cathode hydrogenation | Hydrogenation followed by drying in inert atmosphere | Post-addition of Nafion | Nafion addition and drying in inert atmosphere | Drying continuous treatment | Standing in air (days) | Voltage, (V) (150 mA/cm$^2$) | Remarks |
|---|---|---|---|---|---|---|---|---|---|---|---|
| Comp. Ex. 1 | Suction filtration 3 mg | Slurry 2 mg | x | x | x | x | No post-addtion portion | No post-addtion portion | Drying period 5 | 0.41 | No Nafion treatment/ standing |
| Comp. Ex. 2 | Sputtering 3 mg | Slurry 2 mg | ○ | x | x | ○ | ○ | x | 5 | 0.43 | No Nafion post-treatment/ drying |

The invention claimed is:

1. A process for producing a membrane electrode assembly, comprising:
    a potential holding step for applying a voltage to a catalyst electrode in an aqueous electroconductive solution and holding the potential of the catalyst electrode at a hydrogen evolution potential,
        wherein the catalyst electrode has a structure formed by supporting or depositing a catalytically active material mainly composed of platinum and/or ruthenium on a porous electroconductive carrier;
    a washing/removing step of, after the potential holding step, washing the catalyst electrode and removing the aqueous electroconductive solution held by the catalyst electrode;
    a drying step of, after the washing/removing step, drying the catalyst the catalyst electrode in an atmosphere having a lower oxygen partial pressure than the air;
    a stacking step of, after the drying step, stacking at least an anode, a proton conductive film, and a cathode; and
    a covering step of, at any stage before the stacking step, covering at least a part of the catalytically active material in the catalyst electrode with an ion conductive material to form a covered catalyst electrode,
        wherein the anode and/or cathode of the stacking step is the covered catalyst electrode that was formed by subjecting the catalyst electrode to the potential holding step, the washing/removing step, the drying step, and the covering step.

2. The process according to claim 1, wherein the covering step is carried out before the potential holding step.

3. The process according to claim 1, wherein the covering step is carried out after the drying step.

4. The process according to claim 3, wherein the covering step is carried out in an atmosphere having a lower oxygen partial pressure than the air.

5. The process according to claim 4, wherein the drying step and the covering step are continuously carried out in an atmosphere having a lower oxygen partial pressure than the air without exposure to the air during the steps.

6. The process of claim 1, wherein the covered catalyst electrode is an anode and a fuel for the anode is methanol.

7. The process according to claim 6, wherein not less than 50% by mole of the catalytically active material is accounted for by platinum and/or ruthenium.

8. The process according to claim 1, wherein the ion conductive material is a sulfonic acid group-containing fluororesin, tungstic acid, or phosphotungstic acid.

9. The process according to claim 1, wherein the catalyst electrode has been produced by a slurry method, a deposition impregnation method, or a sputtering method.

10. The process according to claim 1, wherein the time for which the voltage is applied to the catalyst electrode to hold the potential at a hydrogen evolution potential is 1 to 60 min.

11. The process according to claim 1, wherein the washing/removing step is carried out with water washing.

12. The process according to claim 1, wherein the oxygen partial pressure in the drying step is not more than 0.1 atm.

13. The process according to claim 1, wherein the stacking step is carried out by a hot press.

14. The process according to claim 13, wherein the hot pressing is carried out under conditions of temperature 100° C. or above and 180° C. or below, pressure 10 to 200 kg/cm$^2$, and contact bonding time not less than 1 min and not more than 30 min.

* * * * *